United States Patent
Chang et al.

(10) Patent No.: US 12,040,242 B2
(45) Date of Patent: Jul. 16, 2024

(54) THREE-DIMENSIONAL DEVICE STRUCTURE INCLUDING SEAL RING CONNECTION CIRCUIT

(71) Applicant: Taiwan Semiconductor Manufacturing Company Limited, Hsinchu (TW)

(72) Inventors: Jen-Yuan Chang, Hsinchu (TW); Chien-Chang Lee, Hsinchu (TW); Chia-Ping Lai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 17/412,469

(22) Filed: Aug. 26, 2021

(65) Prior Publication Data

US 2023/0067714 A1    Mar. 2, 2023

(51) Int. Cl.
| | |
|---|---|
| H01L 23/552 | (2006.01) |
| H01L 23/10 | (2006.01) |
| H01L 23/522 | (2006.01) |
| H01L 23/535 | (2006.01) |
| H01L 23/538 | (2006.01) |
| H01L 23/60 | (2006.01) |
| H01L 27/06 | (2006.01) |

(52) U.S. Cl.
CPC .......... *H01L 23/10* (2013.01); *H01L 23/5226* (2013.01); *H01L 23/535* (2013.01); *H01L 23/5383* (2013.01); *H01L 23/60* (2013.01); *H01L 27/0688* (2013.01); *H01L 23/5225* (2013.01)

(58) Field of Classification Search
CPC .... H01L 23/10; H01L 23/5226; H01L 23/535
See application file for complete search history.

(56) References Cited

U.S. PATENT DOCUMENTS

| | | | | |
|---|---|---|---|---|
| 4,668,471 | A * | 5/1987 | Futatsuka et al. | C22C 9/04 420/477 |
| 7,808,111 | B2 * | 10/2010 | Trezza | H01L 23/52 |
| 8,461,021 | B2 * | 6/2013 | Yaung | H01L 21/78 438/460 |
| 9,972,603 | B2 * | 5/2018 | Chu et al. | H01L 21/768 |
| 11,004,812 | B2 * | 5/2021 | Hung et al. | H01L 24/05 |
| 11,894,336 | B2 * | 2/2024 | Wang | H01L 24/20 |
| 2018/0138396 | A1 * | 5/2018 | Nagel | H01L 23/544 |
| 2019/0051622 | A1 * | 2/2019 | Chen et al. | H01L 23/585 |
| 2019/0363079 | A1 * | 11/2019 | Thei | H01L 23/481 |
| 2020/0119074 | A1 * | 4/2020 | Ho | H01L 27/14636 |
| 2021/0125910 | A1 * | 4/2021 | Shih | H01L 25/0657 |

(Continued)

*Primary Examiner* — Ismail A Muse
(74) *Attorney, Agent, or Firm* — The Marbury Law Group, PLLC

(57) ABSTRACT

A three-dimensional device structure includes a first die, a second die disposed on the first die, and a connection circuit. The first die includes a first semiconductor substrate, a first interconnect structure disposed on the first semiconductor substrate, and a first seal ring surrounding the interconnect structure. The second die includes a second semiconductor substrate, a second interconnect structure disposed on the second semiconductor substrate, and a second seal ring surrounding the interconnect structure. The first connection circuit electrically couples the first seal ring to the second seal ring to provide an electrostatic discharge path.

20 Claims, 8 Drawing Sheets

(56) References Cited

U.S. PATENT DOCUMENTS

| | | | |
|---|---|---|---|
| 2022/0262695 A1* | 8/2022 | Chang | H01L 23/5389 |
| 2022/0302050 A1* | 9/2022 | Chang | H01L 23/481 |
| 2022/0367392 A1* | 11/2022 | Chang | H01L 24/80 |
| 2023/0187294 A1* | 6/2023 | Lee et al. | H01L 23/18 |

* cited by examiner

THREE-DIMENSIONAL DEVICE STRUCTURE INCLUDING SEAL RING CONNECTION CIRCUIT

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
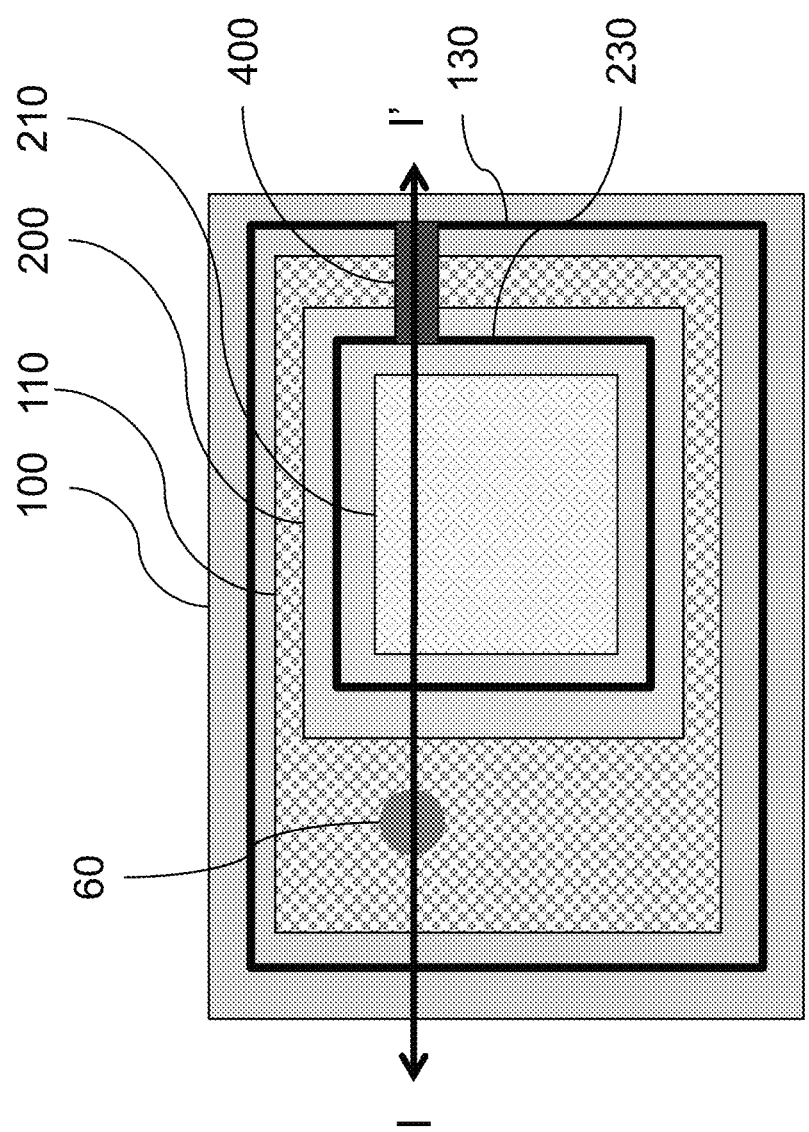
FIG. 1A is a simplified top view of a three-dimensional device structure, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and specifically to three-dimensional device structures that include seal ring connection circuits to electrically connect seal rings of different semiconductor dies. The seal ring connection circuits provide an electrostatic discharge path to prevent damage to the components on the different semiconductor dies due to electrostatic discharge. Accordingly, the three-dimensional device structures disclosed herein are configured to reduce or prevent unwanted electrical discharge, such as plasma-induced wafer arcing.

Figure 1B:
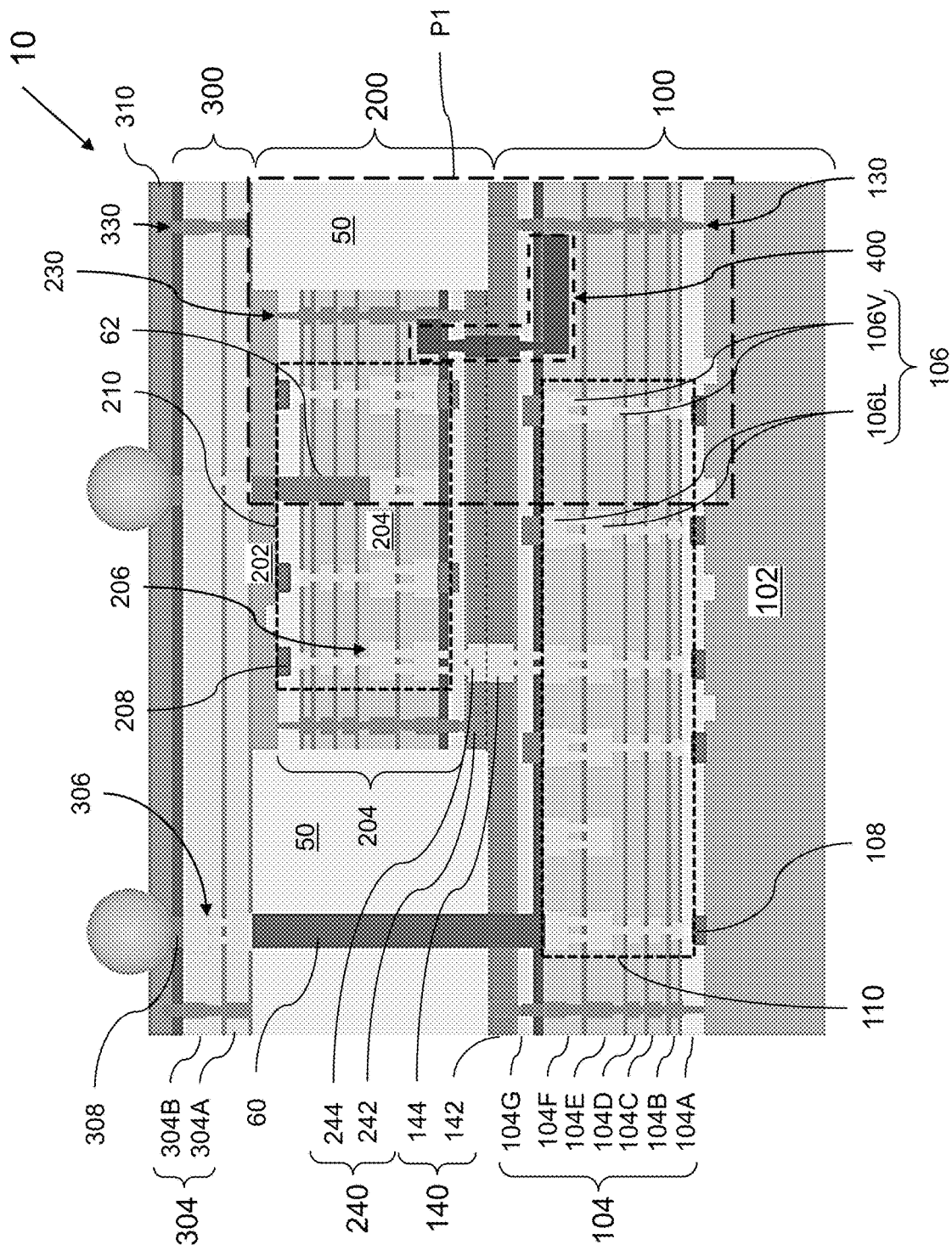
FIG. 1B is a cross-sectional view taken along line I-I' of FIG. 1A.
Figure 1C:
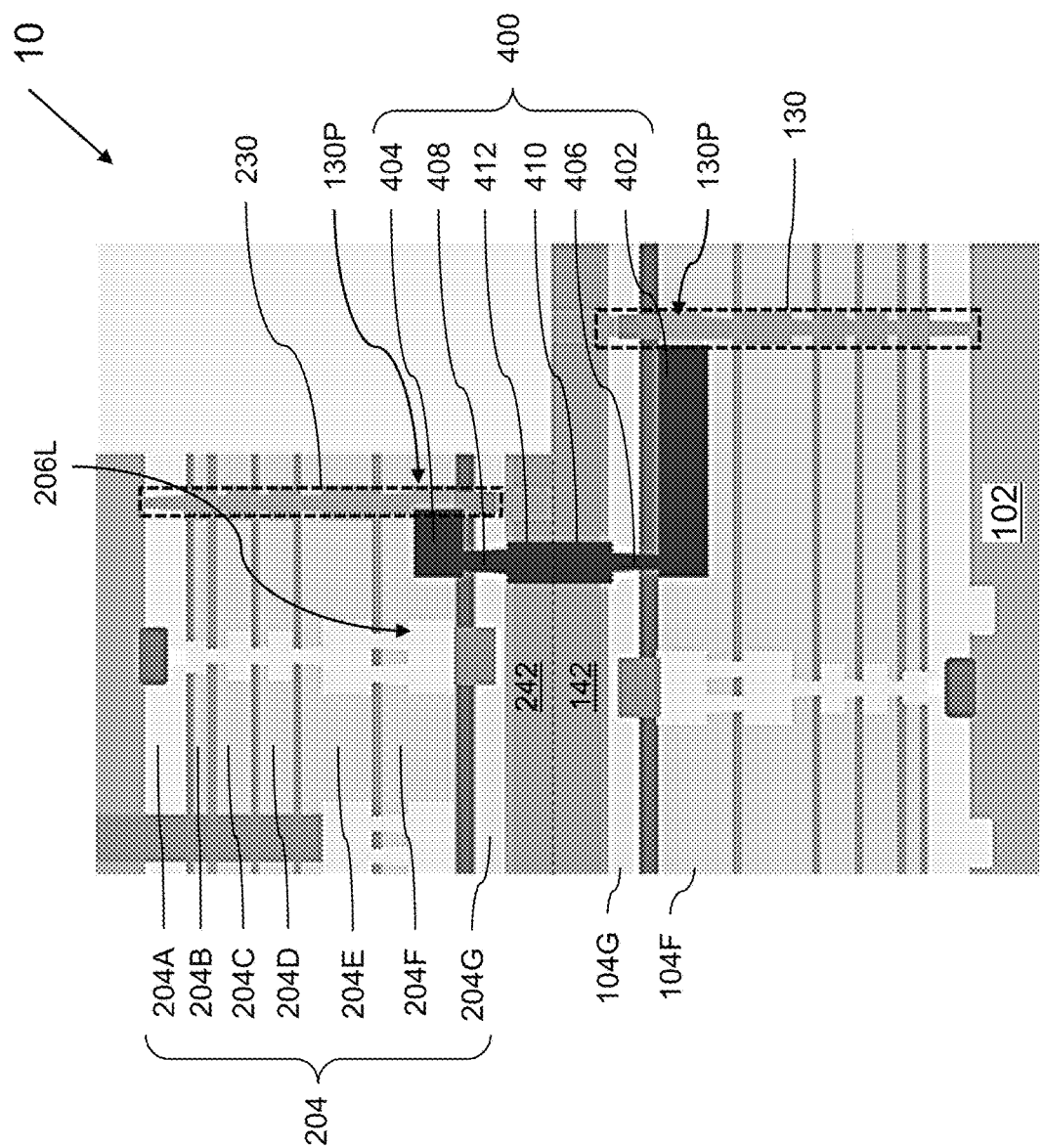
FIG. 1C is an enlarged view of a portion P1 of FIG. 1B.

FIG. 1A is a simplified top view of a three-dimensional device structure 10, according to various embodiments of the present disclosure. FIG. 1B is a cross-sectional view taken along line I-I' of FIG. 1A. FIG. 1C is an enlarged view of a portion P1 of FIG. 1B. Referring to FIGS. 1A-1C, the three-dimensional device structure 10 includes a first die 100 and a second die 200 disposed thereon.

The first die 100 may be, for example, an application-specific integrated circuit (ASIC) chip, an analog chip, a sensor chip, a wireless and radio frequency chip, a voltage regulator chip or a memory chip. In some embodiments, the first die 100 may be an active component or a passive component. In some embodiments, the first die 100 includes a first semiconductor substrate 102, a first dielectric structure 104, a first interconnect structure 110 embedded within the first dielectric structure 104, a first seal ring 130, and a first bonding structure 140.

In some embodiments, the first semiconductor substrate 102 may include an elementary semiconductor such as silicon or germanium and/or a compound semiconductor such as silicon germanium, silicon carbide, gallium arsenide, indium arsenide, gallium nitride or indium phosphide. In some embodiments, the first semiconductor substrate 102 may be a semiconductor-on-insulator (SOI) substrate. In various embodiments, the first semiconductor substrate 102 may take the form of a planar substrate, a substrate with multiple fins, nanowires, or other forms known to people having ordinary skill in the art. Depending on the requirements of design, the first semiconductor substrate 102 may be a P-type substrate or an N-type substrate and may have doped regions therein. The doped regions may be configured for an N-type device or a P-type device.

In some embodiments, the first semiconductor substrate 102 includes isolation structures defining at least one active area, and a first device layer may be disposed on/in the active area. The first device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the first device layer includes a gate structure, source/drain regions, spacers, and the like.

The first dielectric structure 104 may be disposed on a front side of the first semiconductor substrate 102. In some embodiments, the first dielectric structure 104 may include silicon oxide, silicon oxynitride, silicon nitride, a low dielectric constant (low-k) material, or a combination thereof. Other suitable dielectric materials may be within the contemplated scope of disclosure. The first dielectric structure 104 may be a single layer or a multiple-layer dielectric structure. For example, as shown in FIG. 1B, the first dielectric structure 104 may include multiple dielectric layers, such as a substrate planarization layer 104A, inter-layer dielectric (ILD) layers 104B-104F, and an interconnect planarization layer 104G. However, while FIG. 1B illustrates seven dielectric layers, the various embodiments of the present disclosure are not limited to any particular number of layers.

The first dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

A first interconnect structure 110 may be formed in the first dielectric structure 104. The first interconnect structure 110 may include first metal features 106 disposed in the first dielectric structure 104. The first metal features 106 may be any of a variety of vias and metal lines. The first metal features 106 be formed of any suitable electrically conductive material, such as tungsten (W), copper (Cu), a copper alloy, aluminum (Al), an aluminum alloy, combinations thereof, or the like. In some embodiments, barrier layers (not shown) may be disposed between the first metal features 106 and the dielectric layers of first dielectric structure 104, to prevent the material of the first metal features 106 from migrating to the first semiconductor substrate 102. The barrier layer may include tantalum (Ta) tantalum nitride (TaN), titanium (Ti), titanium nitride (TaN), cobalt-tungsten (CoW), or combinations thereof, for example. Other suitable barrier layer materials may be within the contemplated scope of disclosure.

The first metal features 106 may include electrically conductive lines 106L and via structure 106V. The first via structures 106V may operate to electrically connect conductive lines 106L disposed in adjacent dielectric layers 104B-104F. The first metal features 106 may be electrically connected to first pads 108 disposed on the first semiconductor substrate 102, such that the first interconnect structure 110 may electrically connect semiconductor devices formed on the first semiconductor substrate 102.

The first seal ring 130 may extend around the periphery of the first die 100. For example, the first seal ring 130 may be disposed in the first dielectric structure 104 and may laterally surround the interconnect structure 110. The first seal ring 130 may be configured to protect the interconnect structure 110 from contaminant diffusion and/or physical damage during device processing, such as plasma etching and/or deposition processes.

The first seal ring 130 may include copper at an atomic percentage greater than 80%, such as greater than 90% and/or greater than 95% although greater or lesser percentages may be used. The first seal ring 130 may include conductive lines and via structures that are connected to each other, and may be formed simultaneously with the conductive lines 106L and via structures 106V of the first metal features 106 of the interconnect structure 110. The first seal ring 130 may be electrically isolated from the first metal features 106.

In some embodiments, the first metal features 106 and/or the first seal ring 130 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the first metal features 106 and/or the first seal ring 130 may be formed by an electroplating process.

For example, the Damascene processes may include patterning the first dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the first dielectric structure 104.

In particular, the patterning, metal deposition, and planarizing processes may be performed for each of the dielectric layers 104A-104G, in order to form the interconnect structure 110 and/or the first seal ring 130. For example, dielectric layer 104A may be deposited and patterned to form openings. A deposition process may then be performed to fill the openings in the dielectric layer 104A. A planarization process may then be performed to remove the overburden and form metal features 106 in the dielectric layer 104A. These process steps may be repeated to form the dielectric layers 104B-104F and the corresponding metal features 106, and thereby complete the first interconnect structure 110 and/or first seal ring 130.

The first die 100 may include a first bonding structure 140 disposed over the first dielectric structure 104. The first bonding structure 140 may include a dielectric first bonding layer 142 and one or more first bonding features 144. The first bonding layer 142 may be formed by depositing a dielectric material, such as silicon oxide, silicon nitride, a polymer, or a combination thereof, using any suitable deposition process. Other suitable dielectric materials may be within the contemplated scope of disclosure. The first bonding features 144 may be disposed in the first bonding layer 142. The first bonding features 144 may be electrically conductive features formed of the same materials as the first metal features 106. For example, the first bonding features 144 may include tungsten (W), copper (Cu), a copper alloy, aluminum (Al), an aluminum alloy, or a combination thereof, or the like. The first bonding features 144 may include bonding pads and/or via structures, in some embodiments.

The first bonding features 144 may be formed in the first bonding layer 142 by a dual-Damascene processes, or by one or more single-Damascene processes, as described above. In alternative embodiments, the first bonding features 144 may be formed by an electroplating process.

The second die 200 may be disposed over and bonded to the first die 100. The second die 200 may be an application-specific integrated circuit (ASIC) chip, an analog chip, a sensor chip, a wireless and radio frequency chip, a voltage regulator chip or a memory chip, for example. The second die 200 and the first die 100 may be the same type of dies or different types of dies. In some embodiments, the second die 200 may be an active component or a passive component. In some embodiments, the second die 200 is smaller than the first die 100.

In some embodiments, the second die 200 is similar to the first die 100. For example, the second die 200 may include a second semiconductor substrate 202, a second dielectric structure 204, a second interconnect structure 210 embedded within the second dielectric structure 204, a second seal ring 230, and a second bonding structure 240. Thus, the difference between the second die 200 and the first die 100 is discussed in details below.

The second dielectric structure 204 may be disposed over a first side (e.g., front side) of the second semiconductor substrate 202. The second dielectric structure 204 may have a single-layer or multi-layer structure. For example, as shown in FIG. 1C, the second dielectric structure 204 may include multiple dielectric layers, such as a substrate planarization layer 204A, inter-layer dielectric (ILD) layers 204B-204F, and an interconnect planarization layer 204G. However, while FIGS. 1B and 1C illustrates a plurality of dielectric layers forming the second dielectric structure 204, the various embodiments of the present disclosure are not limited to any particular number of layers.

The second interconnect structure 210 may be formed in the second dielectric structure 204. Specifically, the second interconnect structure 210 may be overlapped with and electrically connected to an integrated circuit region of the second semiconductor substrate 202. In some embodiments, the second interconnect structure 210 includes second metal features 206. The second metal features 206 are disposed in the second dielectric structure 204 and may be electrically connected to second pads 208 disposed on the second semiconductor layer 202, such that the second interconnect structure 210 may electrically connect semiconductor devices formed on the second semiconductor layer 202.

The second bonding structure 240 may be similar to the first bonding structure 140. The second bonding structure 240 may be disposed over the first side (e.g., front side) of the second interconnect structure 210. Specifically, the second bonding structure 240 may overlap with the second interconnect structure 210. In some embodiments, the second bonding structure 240 includes at least one dielectric second bonding layer 242 and one or more second bonding features 244. The second bonding features 244 are disposed in the second bonding layer 242. In some embodiments, the second bonding features 244 may include bonding pads and/or via structures.

The second seal ring 230 may be similar to the first seal ring 130. For example, the second seal ring 230 may include copper at an atomic percentage greater than 80%, such as greater than 90% and/or greater than 95%, although greater or lesser percentages of copper may be used. The second seal ring 230 may be disposed over the first side (e.g., front side) of the second semiconductor substrate 202. Specifically, the second seal ring 230 may surround the second interconnect structure 210, may extend through the second dielectric structure 204, and may be electrically insulated from circuit elements of the second semiconductor substrate 202. In some embodiments, the second seal ring 230 may be formed during the formation of the second dielectric structure 204. The second seal ring 230 may be at substantially the same level as the second interconnect structure 210. Specifically, the top surface of the second seal ring 230 may be coplanar with the top surfaces of the uppermost second metal features 206 of the second interconnect structure 210.

In some embodiments, the size of the second die 200 may be different from (e.g., less than) the size of the first die 100. Herein, the term "size" is referred to the length, width and/or area. For example, as shown in the top view of FIG. 1A, the size (e.g., area or footprint) of the second die 200 may be less than the size of the first die 100.

During assembly, the second die 200 may be flipped (e.g., turned upside down) and mounted onto the first die 100. In particular, a second wafer including a plurality of the second dies 200 may be positioned over a first wafer including a plurality of the first dies 100. In other embodiments, the second wafer may be diced to singulate the second dies 200, and the second dies 200 may be individually placed on the first wafer, over respect first dies 100.

In some embodiments, the first and second dies 100, 200 may be face-to-face bonded together by bonding the first bonding structure 140 and the second bonding structure 240. The first bonding structure 140 may be aligned with the second bonding structure 240 and then an anneal operation may bond the bonding structures together. In some embodiments, before the second die 200 is bonded to the first die 100, the second bonding structure 240 and the first bonding structure 140 are aligned, such that the second bonding features 244 are bonded to respective first bonding features 144, and the second bonding layer 242 is bonded to the first bonding layer 142. In some embodiments, the alignment of the first bonding structure 140 and the second bonding structure 240 may be achieved by using an optical sensing method. After the alignment is achieved, the first bonding structure 140 and the second bonding structure 240 may be bonded together by a hybrid bonding process that includes a metal-to-metal bonding and a dielectric-to-dielectric bonding.

In some embodiments, the three-dimensional device structure 10 may include a dielectric encapsulation (DE) layer 50, through-dielectric via (TDV) structures 60, a redistribution layer structure 300, pads 308, and a passivation layer 310, which may be formed after the dicing process. The encapsulation layer may be disposed on the first bonding structure 140, surrounding the second die 200. Specifically, the DE layer 50 may surround the sidewalls of the second die 200, expose the top of the second die 200, and overlay the first side (e.g., front side) of the first die 100. In some embodiments, the second side (e.g., back side) of the second die 200 may be substantially co-planar with the top surface of the DE layer 50. In some embodiments, the DE layer 50 includes a molding compound. The molding compound may include a resin and a filler. In alternative embodiments, the DE layer 50 may include silicon oxide, silicon nitride, or a combination thereof. The DE layer 50 may be formed by spin-coating, lamination, deposition or the like.

In some embodiments, one or more through-substrate via structures 62 may extend through the second semiconductor substrate 202 and electrically contact respective metal features 206 of the second interconnect structure 210.

The TDV structures 60 may be formed through the DE layer 50 and electrically contact the first interconnect structure 110 and the redistribution layer structure 300. In some embodiments, the TDV structures 60 include an electrically conductive material, such as copper, a copper alloy, aluminum, an aluminum alloy, or a combination thereof. In some embodiments, a diffusion barrier layer (not shown) may be disposed around the TDV structures 60, to prevent metal diffusion into the DE layer 50. The diffusion barrier layer may include Ta, TaN, Ti, TiN, CoW, or a combination thereof. Other suitable barrier layer materials may be within the contemplated scope of disclosure.

The redistribution layer structure 300 may be disposed over the second side (e.g., back side) of the second die 200 and over the DE layer 50. The redistribution layer structure 300 may comprise a third dielectric structure 304 having a single-layer or a multi-layer structure. For example, the third dielectric structure 304 may include a first dielectric layer 304A and a second dielectric layer 304B. The redistribution layer structure 300 may include electrically conductive metal features 306 disposed therein. In some embodiments, the metal features 306 may be electrically connected to the TDV structures 60 and/or to the through-substrate via structures 62. In some embodiments, the redistribution layer structure 300 may include a photo-sensitive material such as polybenzoxazole (PBO), polyimide (PI), benzocyclobutene (BCB), a combination thereof, or the like. In some embodiments, the metal features 306 may include copper, nickel, titanium, a combination thereof, or the like. Other suitable conductive metal materials and/or photo-sensitive materials may be within the contemplated scope of disclosure to form the metal features 306.

The redistribution layer structure 300 may include a third seal ring 330. The third seal ring 330 may surround the metal features 306. The third seal ring 330 may include materials and structures similar to that of the seal rings 130 and/or 230.

The pads 308 may be disposed over the redistribution layer structure 300. In some embodiments, the pads 308 may be under bump metallization (UBM) pads for mounting conductive connectors, such as metal pillars, micro-bumps or the like. The pads 308 may include a metal or a metal alloy. The pads 308 may include aluminum, copper, nickel, an alloy thereof, or the like, for example. Other suitable pad materials may be within the contemplated scope of disclosure.

The passivation layer 310 may cover the redistribution layer structure 300 and edge portions of the pads 308. Upper surfaces of the pads 308 may be exposed through the passivation layer 310. In some embodiments, the passivation layer 310 includes silicon oxide, silicon nitride, benzocyclobutene (BCB) polymer, polyimide (PI), polybenzoxazole (PBO), a combination thereof, or the like. Other suitable passivation layer materials may be within the contemplated scope of disclosure.

In various embodiments, a dicing process may be performed to singulate the three-dimensional device structure 10. For example, a grooving process may be performed to form grooves in a first wafer including the first dies 100 and/or in a second wafer including the second dies 200. In particular, first grooves may be formed that surround the first seal ring 130, second seal ring 230, and/or third seal ring 330. The three-dimensional device structures 10 may be diced along the grooves to complete the dicing process, for example, by mechanical cleavage. In this manner, the sidewalls of first die 100, second die 200 embedded within DE layer 50 and redistribution layer structure 300 may be substantially coincident.

In certain embodiments, the grooving process includes performing one or more laser cutting processes. For example, the laser cutting process may be performed several times with an infrared laser such as an Nd-YAG (neodymium-doped yttrium aluminum garnet) laser. In alternative embodiments, the grooving process may include a mechanical cutting process, an inscribing process, or an etching process.

Plasma Induced Wafer Arcing

According to various embodiments, various wafer-level dielectric etching processes, such as plasma etching, may be performed to form features such as trenches and/or through-holes in dielectric layers, after die bonding and/or prior to singulating the three-dimensional device structure 10. For example, the TDV structures 60 may be disposed in trenches formed by etching the DE layer 50, the third seal rings 330 and the metal features 306 may be disposed in trenches formed by etching the third dielectric structure 304, and the pads 308 may be formed in through holes formed by etching the passivation layer 310.

However, a significant challenge for dielectric etching in advanced chip designs is a plasma damage phenomenon called "wafer arcing." Wafer arcing may occur in response to particular wafer surface structure conditions and plasma instability. This randomly occurring problem is characterized by burned metal and "worm-like" arcing marks along the wafer's edge and conducting wide metal lines around the periphery of a die. For example, wafer arcing may occur between the seal rings and other conductive structures, such as bonding pads or interconnect structures.

Arcing-induced particles also increase chamber contamination, requiring more maintenance and downtime. With the impact on yield per wafer, minimizing the frequency of wafer arcing has become a key selection criterion for dielectric etch systems, especially for 300 mm manufacturing.

According to various embodiments, the three-dimensional device structure 10 may include various features to reduce and/or prevent wafer arcing, such as plasma-induced wafer arcing between dies of adjacent three-dimensional device structures 10. In particular, the three-dimensional device structure 10 may include a first seal ring connection circuit 400 configured to electrically connect the first and second seal rings 130, 230. In this manner, any collected charge that may result from the various etching processes may have an electrostatic discharge path through the first and second seal rings 130, 230 by way of the first seal ring connection circuit 400.

The first seal ring connection circuit 400 may be formed of a conductive material. In particular, the first seal ring connection circuit 400 may include copper at an atomic percentage greater than 80%, such as greater than 90% and/or greater than 95%, although greater or lesser percentages may be used. In various embodiments, the first seal ring connection circuit 400 may be formed of the same material as the first and second seal rings 130, 230. The first seal ring connection circuit 400 may include a first contact line 402, a second contact line 404, a first via structure 406, a second via structure 408, a first bonding pad 410, and a second bonding pad 412.

The first contact line 402 may be disposed in the first dielectric structure 104 and may electrically contact the first seal ring 130. The first contact line 402 may extend in a first direction parallel to a plane of first semiconductor substrate 102 and/or a plane of the second semiconductor substrate 202. The first contact line 402 may extend in a first direction from the first seal ring 130 toward the first interconnect structure 110. For example, first contact line 402 may be disposed in a trench formed in the uppermost first dielectric layer 104F. However, the first contact line 402 is not limited to any particular layer of or position within the first dielectric structure 104. In some embodiments, the first contact line 402, an uppermost conductive line 106L, and a portion 130P of the first seal ring 130 may be formed at the same time and/or during the same process. For example, the first contact line 402, the uppermost conductive line 106L, and/or the portion 130P of the first seal ring 130 may be formed by the same single or double Damascene process.

The first via structure 406 may electrically contact the first contact line 402 and may extend in a second direction, substantially perpendicular to the first direction. The first via structure 406 may be disposed in a through-hole (e.g., via hole) formed in the interconnect planarization layer 104G.

The first bonding pad 410 may be formed in a through-hole formed in the first bonding layer 142 and may extend in the second direction. The first bonding pad 410 may be electrically connected to the first via structure 406. In particular, an upper surface of the first bonding pad 410 may be exposed from the first bonding layer 142 and/or may be coplanar with an upper surface of the first bonding layer 142.

The second bonding pad 412 may be formed in a through-hole formed in the second bonding layer 242 and may extend in the second direction. The second bonding pad 412 may be electrically connected to the first bonding pad 410. In particular, a lower surface of the second bonding pad 412 may be exposed from the second bonding layer 242 and/or may be coplanar with a lower surface of the second bonding layer 242. Accordingly, when the second die 200 is positioned over the first die 100, the first and second bonding pads 410, 412 may directly contact one another.

The second via structure 408 may electrically contact the second bonding pad 412 and may extend in a second direction, substantially perpendicular to the first direction. The second via structure 408 may be disposed in a through-hole (e.g., via hole) formed in the second interconnect planarization layer 204G.

The second contact line 404 may be disposed in the second dielectric structure 204 and may electrically contact the second seal ring 230. The second contact line 404 may extend in a first direction extending from the second seal ring 230 toward the second interconnect structure 210. For example, second contact line 404 may be disposed in a trench formed in the lowermost second dielectric layer 204F. However, the second contact line 404 is not limited to any particular layer of or position within the second dielectric structure 204. In some embodiments, the second contact line 404, a lowermost second conductive line 206L and a portion 230P of the second seal ring 230 may be formed at the same time and/or during the same process. For example, the second contact line 404, the lowermost second conductive line 206L and/or the portion 230P of the second seal ring 230 may be formed by the same single or double Damascene process.

The first seal ring 130 may be electrically grounded to the first semiconductor substrate 102 and may be electrically connected to the second seal ring 230 by the first seal ring connection circuit 400. Accordingly, the first seal ring connector 400 may prevent the accumulation of charge in the second seal ring during fabrication processes, such as plasma etching processes. Therefore, the first seal ring connector 400 may be configured to prevent or reduce wafer arcing. As such, the first seal ring connector 400 may increase fabrication yields, by decreasing fabrication losses due to wafer arcing.

According to various embodiments, the first seal ring connection circuit 400 may be constructed of elements formed during fabrication of the first and second dies 100, 200. For example, the first contact line 402, first via structure 406, and first bonding pad 410 may be formed during fabrication of the first die 100, and the second contact line 404, second via structure 408, and second bonding pad 412 may be formed during fabrication of the second die 200, with the bonding pads 410, 412 being bonded during bonding of the first and second dies 100, 200.

Figure 2A:
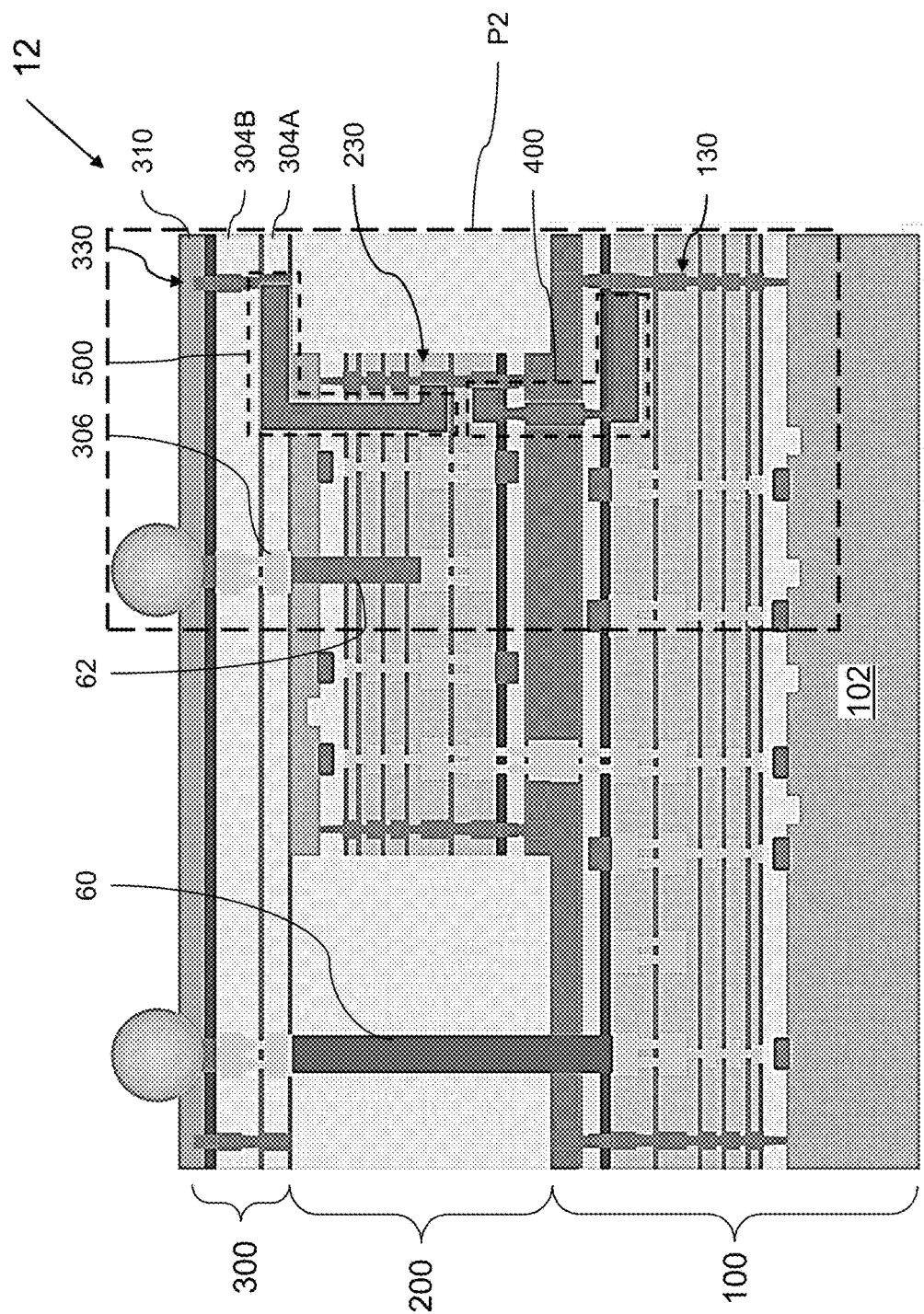
FIG. 2A is a cross-sectional view of a three-dimensional device structure, according to various embodiments of the present disclosure.
Figure 2B:
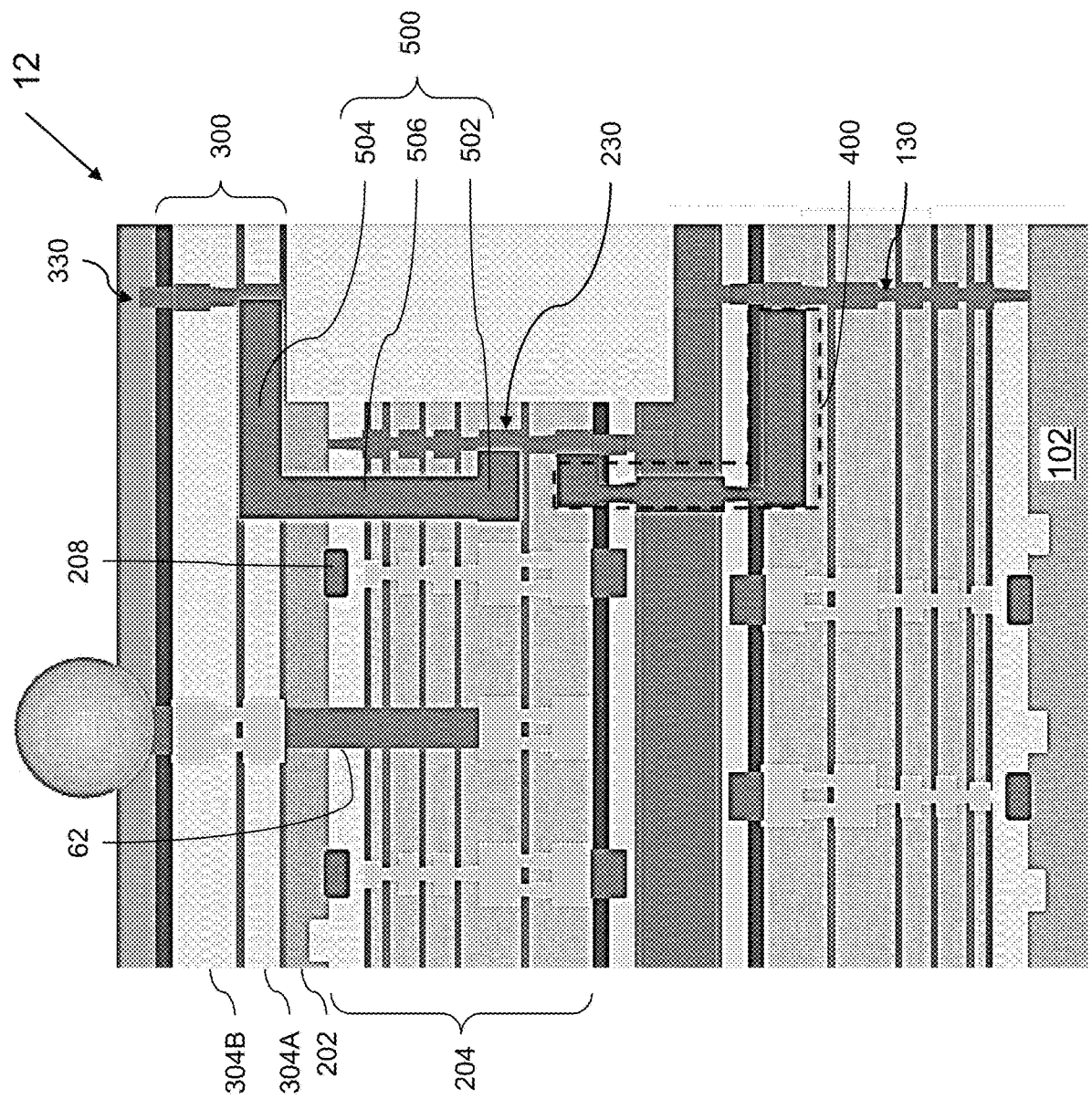
FIG. 2B is an enlarged view of a portion P2 of FIG. 2A.

FIG. 2A is a cross-sectional view of a three-dimensional device structure 12, according to various embodiments of the present disclosure, and FIG. 2B is an enlarged view of a portion P2 of FIG. 2A. The three-dimensional device structure 12 is similar to the three-dimensional device structure 10 of FIGS. 1A-1C. As such, only the differences there between will be described in detail.

Referring to FIGS. 2A and 2B, the three-dimensional device structure 12 includes a first die 100, a second die 200, a redistribution layer structure 300 and a first seal ring connection circuit 400, as shown in FIGS. 1A-1C. However, the three-dimensional device structure 12 additionally includes a second seal ring connection circuit 500.

The second seal ring connection circuit 500 may be configured to electrically connect the second seal ring 230 to the third seal ring 330 of the redistribution layer structure 300. Accordingly, the second seal ring connection circuit 500 may be formed of an electrically conductive material. For example, the second seal ring connection circuit 500 may include copper at an atomic percentage greater than 80%, such as greater than 90% and/or greater than 95%, although greater or lesser percentages may be used. In various embodiments, the second seal ring connection circuit 500 may be formed of the same material as the second and third seal rings 230, 330.

With reference to FIG. 2B, the second seal ring connection circuit 500 may include a first contact line 502, a second contact line 504, and through-substrate via structure 506. The first contact line 502 be disposed in the second dielectric structure 204 and may electrically contact the second seal ring 230. The first contact line 502 may extend in the first direction, parallel to a plane of the first semiconductor substrate 102 and/or the second semiconductor substrate 202. For example, the first contact line 502 may be disposed in a trench formed in the second dielectric layer 204B. However, the location of the first contact line 502 is not limited to any particular layer of the second dielectric structure 204. In some embodiments, the first contact line 502 may be formed during fabrication of the second die 200.

The second contact line 504 may extend through the redistribution layer structure 300 in the first direction and may electrically contact the third seal ring 330. For example, the second contact line 504 may be dispose in a channel formed in a lowermost dielectric layer 304A of the redistribution layer structure 300.

The through-substrate via structure 506 may extend in the second direction and may electrically contact the first and second contact lines 502, 504. For example, the through-substrate via structure 506 may be disposed in a through hole that extends through the second semiconductor substrate 202 and one or more of the dielectric layers of the dielectric structure 204. In some embodiments, the through-substrate via structures 62 and the through-substrate via structure 506 may be formed during the same deposition process. For example, the through-substrate via structures 62, 506 may be formed during the same single or dual-Damascene process.

In various embodiments, the through-substrate via structure 506 and the second contact line 504 may be formed after bonding of the first and second dies 100, 200. For example, the through-substrate via structure 506 and the second contact line 504 may be formed during fabrication of the redistribution layer structure 300 and/or the through-substrate via structures 62. In some embodiments, the second contact line 504 may be formed during fabrication of the metal features 306 in the first dielectric layer 304A of the redistribution layer structure 300.

Accordingly, the second seal ring connection circuit 500 may be configured to electrically ground the third seal ring 330 to the second seal ring 230, and the first seal ring connection circuit 400 may operate to ground the second seal ring 230 to the first seal ring 130, which is grounded to the first semiconductor substrate 102. As such, the first and second seal ring connection circuits 400, 500 may prevent charge accumulation in the second and third seal rings 230, 330, thereby preventing and/or reducing wafer arcing. An electrostatic discharge path may be provided to each of the first die 100, second die 200 and redistribution layer structure 300. As such, the first and second seal ring connection circuits 400, 500 may increase fabrication yields, by decreasing fabrication losses due to wafer arcing.

According to various embodiments, provided are seal ring connection circuits that may include elements formed during die fabrication. For example, the first seal ring connection circuit 400 of FIGS. 1A-2B may include contact lines 402, 404, via structures 406, 408, and bonding pads 410, 412 formed during the fabrication of the first and second dies 100, 200, with the bonding pads 410, 412 being bonded during bonding of the first and second dies 100, 200.

Figure 3:
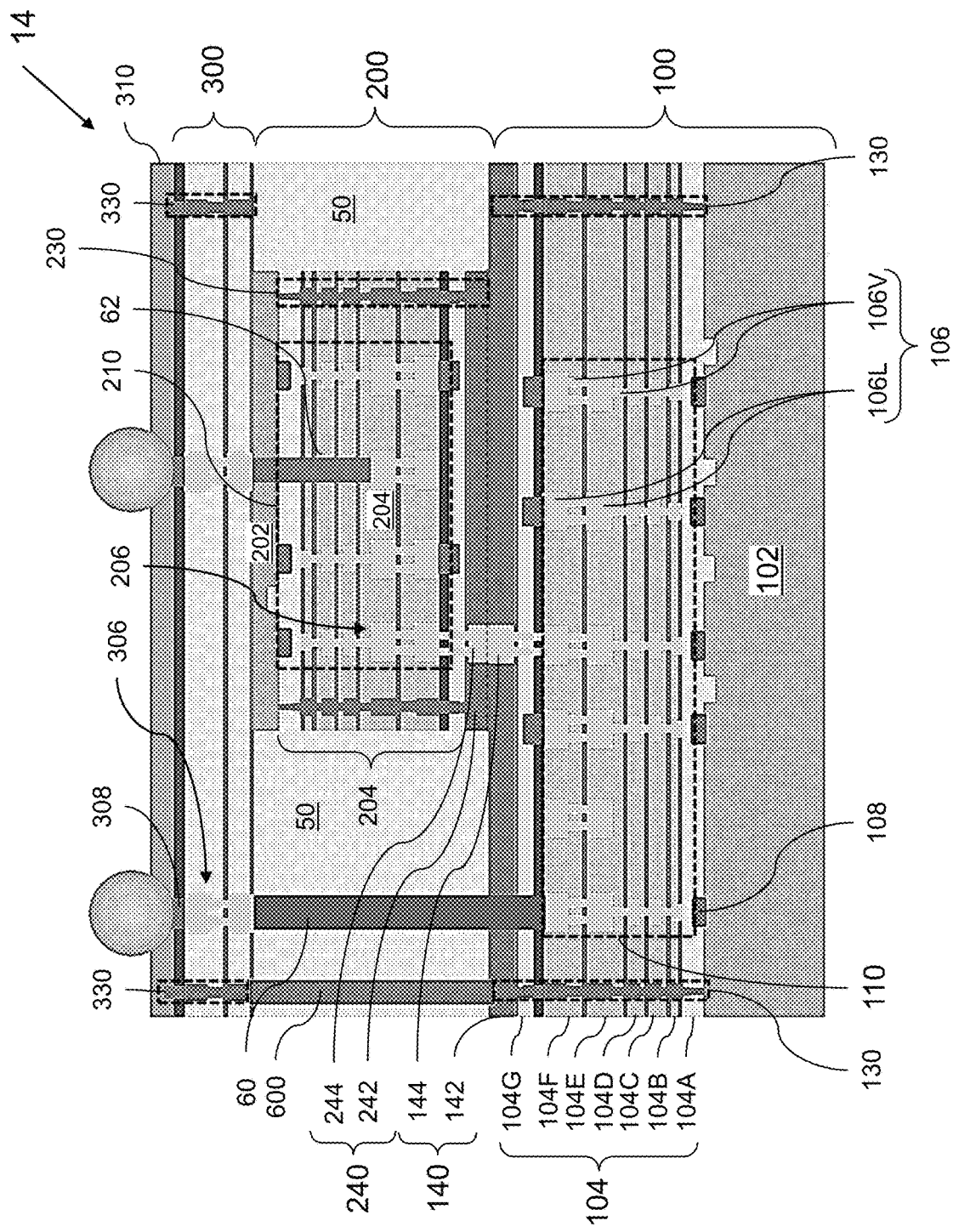
FIG. 3 is a cross-sectional view of a three-dimensional device structure, according to various embodiments of the present disclosure.

FIG. 3 is a cross-sectional view of a three-dimensional device structure 14, according to various embodiments of the present disclosure. The three-dimensional device structure 14 is similar to the three-dimensional device structure 10 of FIGS. 1A-1C. As such, only the differences there between will be described in detail.

Referring to FIG. 3, the three-dimensional device structure 14 includes a first die 100, a second die 200, and a redistribution layer structure 300. However, the three-dimensional device structure 14 includes a third seal ring connection circuit 600.

The third seal ring connection circuit 600 may be configured to electrically connect the first seal ring 130 to the third seal ring 330 of the redistribution layer structure 300. Accordingly, the third seal ring connection circuit 600 may be formed of an electrically conductive material. For example, the third seal ring connection circuit 600 may include copper at an atomic percentage greater than 80%, such as greater than 90% and/or greater than 95%, although greater or lesser percentages may be used. In various embodiments, the third seal ring connection circuit 600 may be formed of the same material as the first and third seal rings 130, 330.

The third seal ring connection circuit 600 may extend in the second direction through the DE layer 50. For example, the third seal ring connection circuit 600 may be a via structure that extends through a through hole formed in the DE layer 50 by an etching process. In some embodiments, the third seal ring connection circuit 600 and the TDV structures 60 may be formed during the same process. For example, the third seal ring connection circuit 600 and the TDV structures 60 may be formed during the same single or dual-Damascene process, which may be performed after bonding of the first and second dies 100, 200, and prior to the formation of the redistribution layer structure 300.

Accordingly, the third seal ring connection circuit 600 may be configured to electrically ground the third seal ring 330 to the first seal ring 130, which is grounded to the first semiconductor substrate 102. As such, the third seal ring connection circuits 600 may prevent charge accumulation in the third seal ring 330 by providing an electrostatic discharge path, thereby preventing and/or reducing wafer arcing. As such, the third seal ring connection circuit 600 may increase fabrication yields, by decreasing fabrication losses due to wafer arcing.

In some embodiments, the three-dimensional device structure 14 may optionally also include the first seal ring connection circuit 400 and/or the second seal ring connection circuit 500. In such embodiments, both the second seal ring 230 and the third seal ring 330 may be electrically grounded to the first semiconductor substrate 102.

Figure 4:
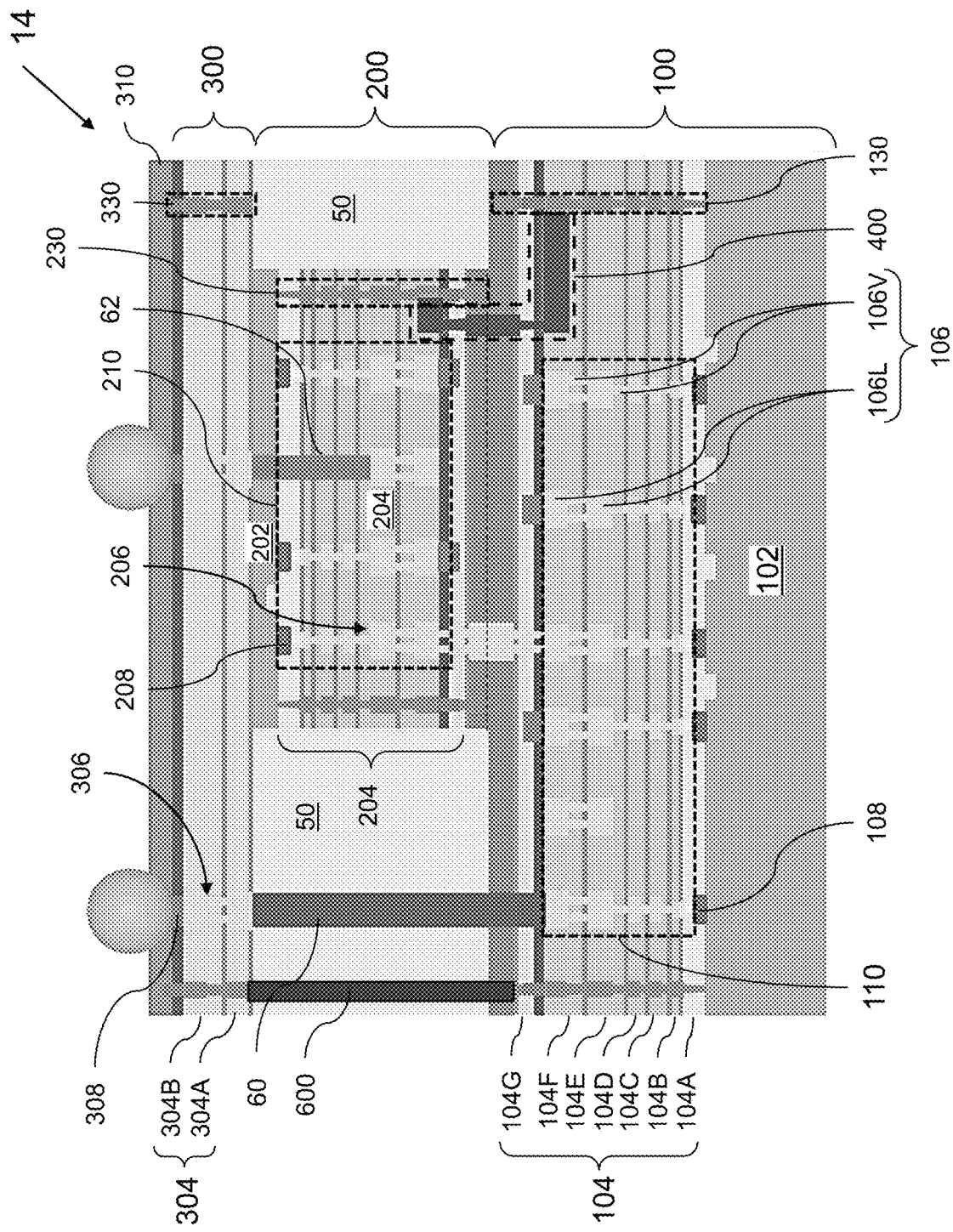
FIG. 4 is a cross-sectional view showing a modified version of the three-dimensional device structure of FIG. 3.

For example, FIG. 4 is a cross-sectional view showing a modified version of the three-dimensional device structure 14 of FIG. 3. Referring to FIG. 4, the three-dimensional device structure 14 additionally includes the first seal ring connection circuit 400. As such, the second and third seal rings 230, 330 may be both electrically connected to the first seal ring 130, and thereby grounded to the first semiconductor substrate 102. In other embodiments, the second seal ring connection circuit 500 may be substituted for the first seal ring connection circuit 400.

Figure 5:
FIG. 5 is a flow chart showing a method of manufacturing a three-dimensional device structure, according to various embodiments of the present disclosure.

FIG. 5 is a flow chart showing a method of forming a three-dimensional device structure, according to various embodiments of the present disclosure. Referring to FIGS. 1A-5, in step 601, the method may include bonding a first die 100 to a second die 200. The attachment process may include an annealing process configured to bond first bonding structures 140 to second bonding structures 240, such that the first die 100 and second die 200 may be physically and electrically connected. In some embodiments, the bonding process may include electrically connecting bonding pads 410, 412 of a first connection circuit 400, to electrically couple a first seal ring 130 to a second seal ring 230.

In step 602, the method may include depositing a DE layer 50 on the first die 100 and around second die 200. In some embodiments, the method may further include an optional step 603 of forming a third connection circuit 600 that extends through the DE layer 50 to contact the first seal ring 130.

In step 604, the method may include forming a redistribution layer structure 300 over the second die 200 and the DE layer 50. In some embodiments, in an optional step 605, the third connection circuit 600 may be electrically coupled to a third seal ring 330 formed in the redistribution layer structure 300. In various embodiments, an optional step 606 may be performed that may include forming a second connection circuit 500 that electrically connects the second seal ring 230 to the third seal ring 330.

In step 607, the method may include dicing a first wafer including a plurality of the first dies 100 to singulate the three-dimensional device structure 10, 12, 14. In other embodiments, step 607 may include dicing the first wafer and a second wafer including a plurality of the second dies 200, to singulate the three-dimensional device structure 10, 12, 14. In such embodiments, the sidewall surfaces of the first die 100, second die 200 with DE layer 50 and redistribution layer structure 300 may be substantially coincident.

In various embodiments, the method may include preventing wafer arcing by electrically grounding the second seal ring 230 to the first seal ring 130, which in turn is grounded to the first semiconductor substrate 102, using the first connection circuit 400. The first semiconductor substrate 102 may be grounded to an underlying substrate, such as a wafer processing chuck or the like. In this manner, an electrostatic discharge path may be provided to the first die 100 and second die 200.

In some embodiments, the method may include preventing wafer arcing by electrically grounding the third seal ring 330 to the first seal ring 130, using the third connection circuit 600. In addition, the method may include electrically grounding the second seal ring 230, by using the first or second connection circuits 400, 500. In this manner, an electrostatic discharge path may be provided to the first die 100, the second die 200 and the redistribution layer structure 300. As such, electrical charge is prevented from accumulating in the second seal ring 230 during processing of the three-dimensional device 10, 12, 14, such as during plasma etching or deposition processes.

Various embodiments provide a three-dimensional device structure 10 that includes a first die 100, a second die 200 disposed on the first die 100, and a first connection circuit 400. The first die 100 includes a first semiconductor substrate 102, a first interconnect structure 110 disposed on the first semiconductor substrate 102, and a first seal ring 130 surrounding the first interconnect structure 110. The second die 200 includes a second semiconductor substrate 202, a second interconnect structure 210 disposed on the second semiconductor substrate, and a second seal ring 230 surrounding the second interconnect structure 210. The first connection circuit 400 electrically coupling the first seal ring 130 to the second seal ring 230.

Various embodiments provide a three-dimensional device structure 12 that includes a first die 100, a second die 200 disposed on the first die 100, a redistribution layer structure 300 disposed over the second die 200, a first connection circuit 400, and a second connection circuit 500. The first die 100 includes a first semiconductor substrate 102, a first interconnect structure 110 disposed on the first semiconductor substrate 102, and a first seal ring 130 surrounding the first interconnect structure 110. The second die 200 includes a second semiconductor substrate 202, a second interconnect structure 210 disposed on the second semiconductor substrate, and a second seal ring 230 surrounding the second interconnect structure 210. The first connection circuit 400 electrically coupling the first seal ring 130 to the second seal ring 230. The second connection circuit 500 electrically coupling the second seal ring 230 to the third seal ring 330.

Various embodiments provide a three-dimensional device structure 14 that includes a first die 100, a second die 200 disposed on the first die 100, a redistribution layer structure 300 disposed over the second die 200, and a third connection circuit 600. The first die 100 includes a first semiconductor substrate 102, a first interconnect structure 110 disposed on the first semiconductor substrate 102, and a first seal ring 130 surrounding the first interconnect structure 110. The second die 200 includes a second semiconductor substrate 202, a second interconnect structure 210 disposed on the second semiconductor substrate, and a second seal ring 230 surrounding the second interconnect structure 210. The redistribution layer structure 300 includes a third seal ring 330. The third connection circuit 600 electrically coupling the first seal ring 130 to the third seal ring 330.

Various embodiments further provide a method for forming a three-dimensional device structure 10, 12, 14. The method including the step 601 of bonding a first die 100 to a second die 200. The method may further include the step 602 of depositing a DE layer 50 on the first die 100 and around second die 200. The method may further include the step 604 of forming a redistribution layer structure 300 over the second die 200 and the DE layer 50. The method may further include the step 607 of singulating a first wafer into a plurality of dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional device structure comprising:
a first die comprising:
a first semiconductor substrate;
a first dielectric structure disposed on the first semiconductor substrate;
a first interconnect structure formed within in the first dielectric layer structure; and
a first seal ring surrounding the first interconnect structure;
a second die disposed on the first die and comprising:
a second semiconductor substrate;
a second dielectric structure disposed on the second semiconductor substrate;
a second interconnect structure formed within in the second dielectric layer; and
a second seal ring surrounding the second interconnect structure; and
a first connection circuit electrically coupling the first seal ring to the second seal ring,
wherein the first seal ring and the second seal ring are laterally offset, such that the first seal ring and the second seal ring do not vertically overlap in a direction perpendicular to an upper surface of the first semiconductor substrate, and
wherein the first connection circuit extends through the first dielectric structure within a first perimeter of the first seal ring and extends through the second dielectric structure within a second perimeter of the second seal ring.

2. The three-dimensional device structure of claim 1, wherein the first connection circuit comprises:
a first contact line extending from the first seal ring toward the first interconnect structure, in a first direction parallel to the upper surface of the first substrate;
a first via structure extending from the first contact line, in a second direction perpendicular to the first direction; and
a first bonding pad extending from the first via structure, in the second direction.

3. The three-dimensional device structure of claim 2, wherein the first connection circuit further comprises:
a second contact line extending from the second seal ring toward the second interconnect structure, in the first direction;
a second via structure extending from the second contact line, in the second direction; and
a second bonding pad extending from the second via structure to the first bonding pad, in the second direction.

4. The three-dimensional device structure of claim 1, wherein the first seal ring is electrically grounded to the first semiconductor substrate.

5. The three-dimensional device structure of claim 1, wherein the first seal ring, the second seal ring, and the first connection circuit comprise the same conductive material.

6. The three-dimensional device structure of claim 1, wherein the first seal ring, the second seal ring, and the first connection circuit comprise at least 95% copper.

7. The three-dimensional device structure of claim 1, wherein:
the first die further comprises a first bonding structure disposed over the first interconnect structure;
the second die further comprises a second bonding structure disposed between the second interconnect structure and the first interconnect structure; and
the first connection circuit extends through the first and second bonding structures.

8. The three-dimensional device structure of claim 1, further comprising a redistribution layer structure disposed over the second die and comprising:
metal features electrically connected to the first interconnect structure and the second interconnect structure; and
a third seal ring surrounding the metal features.

9. The three-dimensional device structure of claim 8, further comprising a second connection circuit electrically coupling the second seal ring to the third seal ring.

10. The three-dimensional device structure of claim 9, wherein the first connection circuit and the second connection circuit are electrically isolated from the first interconnect structure and the second interconnect structure.

11. A three-dimensional device structure comprising:
a first die comprising:
a first semiconductor substrate;
a first dielectric structure disposed on the first semiconductor substrate;
a first interconnect structure formed within the first dielectric layer structure; and
a first seal ring surrounding the first interconnect structure;
a second die disposed on the first die and comprising:
a second semiconductor substrate;
a second dielectric structure disposed on the second semiconductor substrate;
a second interconnect structure formed within the second dielectric layer; and
a second seal ring surrounding the second interconnect structure;
a redistribution layer structure disposed over the second die and comprising a third seal ring;
a first connection circuit electrically coupling the first seal ring to the second seal ring; and
a second connection circuit electrically coupling the second seal ring to the third seal ring,
wherein the first seal ring and the second seal ring are laterally offset, such that the first seal ring and the second seal ring do not vertically overlap in a direction perpendicular to an upper surface of the first semiconductor substrate, and
wherein the first connection circuit extends through the first dielectric structure within a first perimeter of the first seal ring and extends through the second dielectric structure within a second perimeter of the second seal ring.

12. The three-dimensional device structure of claim 11, wherein the first connection circuit and the second connection circuit are electrically isolated from the first interconnect structure and the second interconnect structure.

13. The three-dimensional device structure of claim 11, wherein:
the first seal ring is electrically grounded to the first semiconductor substrate; and
the first interconnect structure is electrically connected to the second interconnect structure.

14. The three-dimensional device structure of claim 11, wherein the second connection circuit comprises:
a first contact line extending from the first seal ring toward the first interconnect structure, in a first direction parallel to an upper surface of the first semiconductor substrate;
a through-substrate via structure extending from the first contact line and through the second semiconductor substrate, in a second direction perpendicular to the first direction; and
a second contact line extending from the through-substrate via structure to the third seal ring, in the first direction.

15. A three-dimensional device structure comprising:
a first die comprising:
a first semiconductor substrate;
a first interconnect structure disposed on the first semiconductor substrate; and
a first seal ring surrounding the first interconnect structure; and
a second die disposed on the first die and comprising:
a second semiconductor substrate;
a second interconnect structure disposed on the second semiconductor substrate; and
a second seal ring surrounding the second interconnect structure;
a redistribution layer structure disposed over the second die and comprising a third seal ring; and
a first connection circuit electrically connecting the first seal ring and the third seal ring,
wherein the first seal ring and the second seal ring are laterally offset, such that the first seal ring and the second seal ring do not vertically overlap in a direction perpendicular to an upper surface of the first semiconductor substrate.

16. The three-dimensional device structure of claim 15, wherein the first connection circuit comprises a through-dielectric via (TDV) structure that extends through a dielectric encapsulation (DE) layer that is disposed on the first die and surrounds sidewalls of the second die.

17. The three-dimensional device structure of claim 15, further comprising a second connection circuit electrically coupling the first seal ring to the second seal ring.

18. The three-dimensional device structure of claim 15, further comprising a second connection circuit electrically coupling the second seal ring to the third seal ring.

19. The three-dimensional device structure of claim 15, wherein the second connection circuit comprises:
a first contact line extending from the first seal ring toward the first interconnect structure, in a first direction parallel to an upper surface of the first substrate;
a through-substrate via structure extending from the first contact line and through the second semiconductor substrate, in a second direction perpendicular to the first direction; and
a second contact line extending from the through-substrate via structure to the third seal ring, in the first direction.

20. The three-dimensional device structure of claim 15, wherein the first seal ring is electrically grounded to the first semiconductor substrate.

* * * * *